_(12)_ United States Patent
Moon et al.

(10) Patent No.: US 8,115,293 B2
(45) Date of Patent: Feb. 14, 2012

(54) INTEGRATED CIRCUIT PACKAGING SYSTEM WITH INTERCONNECT AND METHOD OF MANUFACTURE THEREOF

(75) Inventors: DongSoo Moon, Ichon-si (KR); Taewoo Lee, Icheon-Si (KR); Soo-San Park, Seoul (KR); SooMoon Park, Jinju-si (KR); Sang-Ho Lee, Yeoju (KR)

(73) Assignee: Stats Chippac Ltd., Singapore (SG)

( * ) Notice: Subject to any disclaimer, the term of this patent is extended or adjusted under 35 U.S.C. 154(b) by 239 days.

(21) Appl. No.: 12/633,789

(22) Filed: Dec. 8, 2009

(65) Prior Publication Data

US 2011/0133325 A1     Jun. 9, 2011

(51) Int. Cl.
  *H01L 21/60*     (2006.01)
(52) U.S. Cl. ........... 257/686; 257/778; 257/E21.499; 257/723; 438/107; 438/108
(58) Field of Classification Search ........... 257/686, 257/723, 777, 778, E21.499, 21.511, E23.019, 257/E23.01; 438/107, 108
See application file for complete search history.

(56) References Cited

U.S. PATENT DOCUMENTS

| | | | |
|---|---|---|---|
| 6,541,848 B2 | 4/2003 | Kawahara et al. | |
| 7,262,080 B2 * | 8/2007 | Go et al. | 438/109 |
| 7,271,496 B2 | 9/2007 | Kim | |
| 7,288,835 B2 * | 10/2007 | Yim et al. | 257/685 |
| 7,309,913 B2 * | 12/2007 | Shim et al. | 257/686 |
| 7,557,443 B2 * | 7/2009 | Ye et al. | 257/723 |
| 7,919,871 B2 * | 4/2011 | Moon et al. | 257/777 |
| 7,968,979 B2 * | 6/2011 | Pagaila et al. | 257/660 |
| 2009/0236720 A1 | 9/2009 | Yoon et al. | |
| 2009/0261466 A1 | 10/2009 | Pagaila et al. | |
| 2009/0303690 A1 | 12/2009 | Lee et al. | |

OTHER PUBLICATIONS

U.S. Appl. No. 12/188,995, filed Aug. 8, 2008, Pagaila et al.

* cited by examiner

*Primary Examiner* — Roy Potter
(74) *Attorney, Agent, or Firm* — Mikio Ishimaru

(57) ABSTRACT

A method of manufacture of an integrated circuit packaging system includes: providing a first substrate; mounting a component over the first substrate; mounting a stack substrate over the component, the stack substrate having an inner pad and an outer pad connected to the first substrate; mounting a first exposed interconnect on the outer pad; forming a first encapsulation over the stack substrate, the first exposed interconnect partially exposed and the inner pad partially exposed in a recess of the first encapsulation; and mounting a second exposed interconnect on the inner pad.

20 Claims, 5 Drawing Sheets

INTEGRATED CIRCUIT PACKAGING SYSTEM WITH INTERCONNECT AND METHOD OF MANUFACTURE THEREOF

TECHNICAL FIELD

The present invention relates generally to an integrated circuit packaging system, and more particularly to a system for an integrated circuit packaging system with interconnect.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as smart phones, cell phones, digital cameras, portable computers, location based services devices, and voice recorders, as well as in many larger electronic systems, such as cars, planes, and industrial control systems.

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance. Different challenges arise from increased functionality integration and miniaturization.

Thus, a need still remains for an integrated circuit packaging system including increased integration and more miniaturization. In view of the ever-increasing need to increase functionality and reduce sizes, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a first substrate; mounting a component over the first substrate; mounting a stack substrate over the component, the stack substrate having an inner pad and an outer pad connected to the first substrate; mounting a first exposed interconnect on the outer pad; forming a first encapsulation over the stack substrate, the first exposed interconnect partially exposed and the inner pad partially exposed in a recess of the first encapsulation; and mounting a second exposed interconnect on the inner pad.

The present invention provides an integrated circuit packaging system, including: a first substrate; a component over the first substrate; a stack substrate over the component, the stack substrate having an inner pad and an outer pad connected to the first substrate; a first exposed interconnect on the outer pad; a first encapsulation over the stack substrate, the first exposed interconnect partially exposed and the inner pad partially exposed in a recess of the first encapsulation; and a second exposed interconnect on the inner pad.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
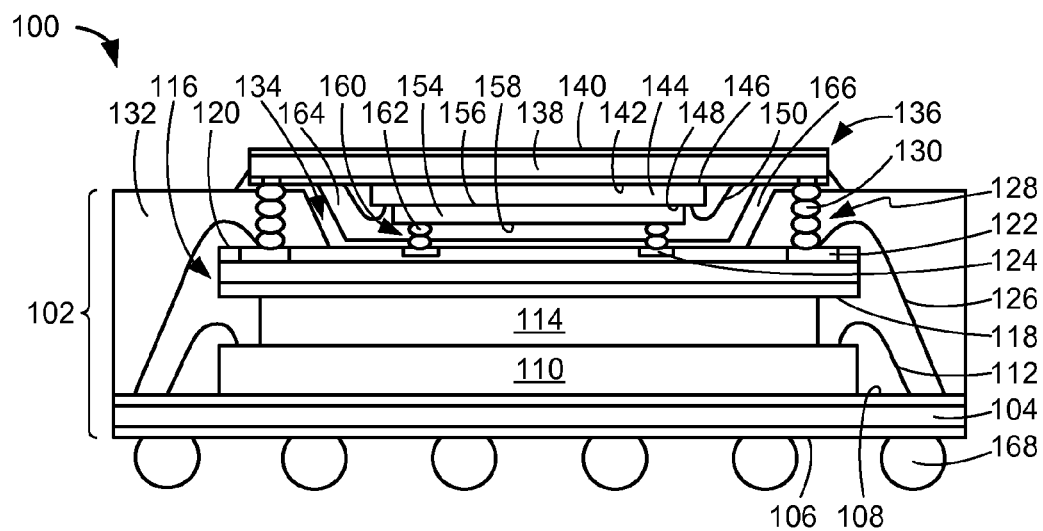
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Some package-on-package (PoP) systems have solder balls for interconnecting top and bottom packages. There can be solder ball bridging problems particularly during solder ball attach reflow processes. Embodiments of the present invention provide answers/solutions to these problems.

Figure 2:
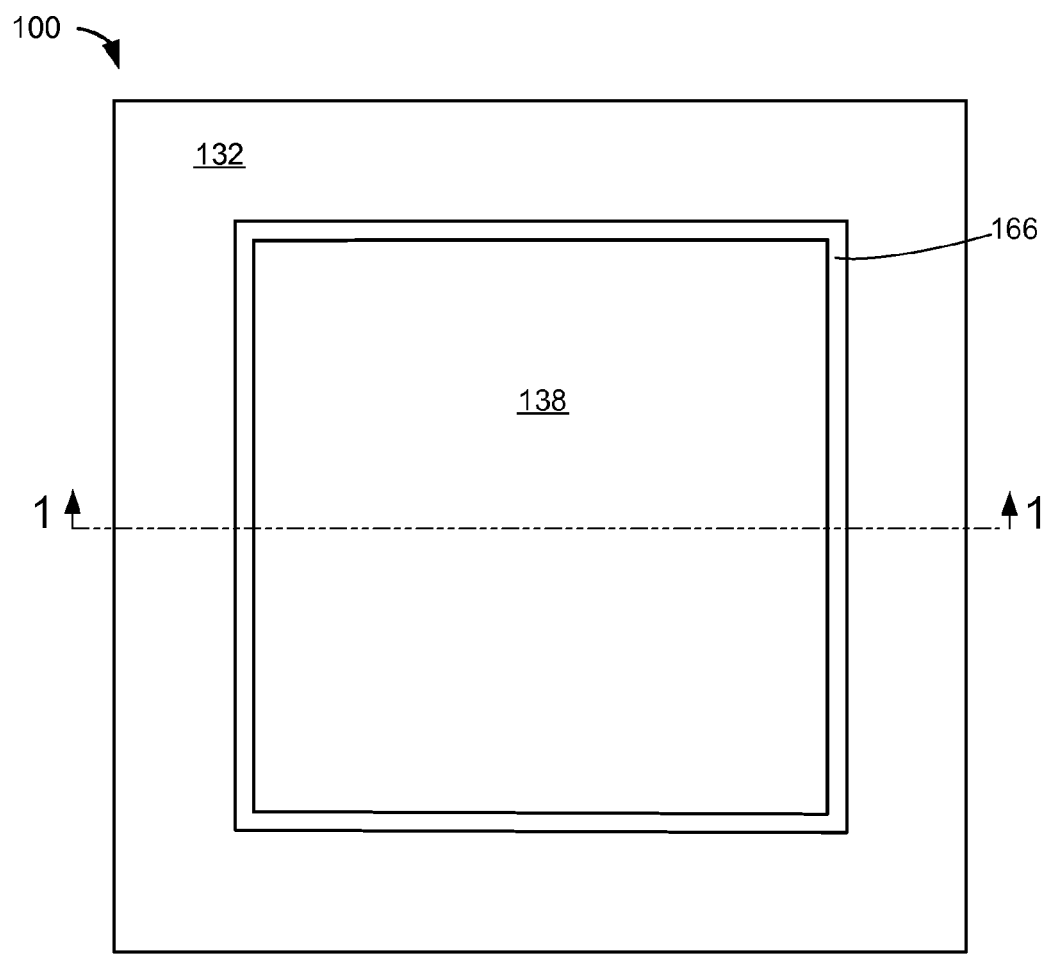
FIG. 2 is a top view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can represent a configuration of a packaging system, which can include a package-on-package (PoP) or a fan-in PoP (FiPoP).

The integrated circuit packaging system 100 can include a first integrated circuit package 102. The first integrated circuit package 102 can include a first substrate 104, such as a laminated plastic or ceramic substrate, an organic or inorganic substrate, a carrier, or a printed circuit board (PCB).

The first substrate 104 can include land pads, bond sites, conductive layers, or traces, for providing electrical connectivity. The first substrate 104 can include a first substrate bottom surface 106 and a first substrate top surface 108 opposite or over the first substrate bottom surface 106.

The first integrated circuit package 102 can include a component 110, such as an integrated circuit die, a wirebond integrated circuit, or a chip, attached to or mounted over the first substrate top surface 108. The component 110 can be connected to the first substrate top surface 108 with a component interconnect 112, such as a bond wire, a ribbon bond wire, or a conductive wire. The first integrated circuit package 102 can include an attach layer 114, such as a wire-in-film (WIF), a spacer, a paste, an adhesive, or a dielectric.

A stack substrate 116, such as an interposer, a chip, an internal stacking module (ISM), an insulator, a multi-layer substrate, a laminated substrate, a lead frame, a plate, or a die, can be mounted over the component 110 with the attach layer 114. The stack substrate 116 can include a via, a redistribution line (RDL), a trace, a multi-layer wire, or any combination thereof. The stack substrate 116 can include functions for stacking, interposing, interfacing, or interconnecting multiple integrated circuit packaging systems or three-dimensional (3D) integrated circuit packaging systems.

The stack substrate 116 can include a stack substrate bottom surface 118 and a stack substrate top surface 120 opposite or over the stack substrate bottom surface 118. The stack substrate bottom surface 118 can be over the attach layer 114.

The stack substrate 116 can include an outer pad 122, such as a wire bonding pad, a contact pad, an electrical contact, or a lead, formed along the periphery of the stack substrate 116. The outer pad 122 can be formed on the stack substrate top surface 120.

The stack substrate 116 can include an inner pad 124, such as a wire bonding pad, a contact pad, an electrical contact, or a lead, formed farther from the periphery of the stack substrate 116 than the outer pad 122. The inner pad 124 can be formed on the stack substrate top surface 120 and adjacent the outer pad 122.

The stack substrate 116 can be connected to the first substrate 104 with a stack substrate interconnect 126, such as a bond wire, a ribbon bond wire, or a conductive wire. The stack substrate interconnect 126 can be connected to the first substrate top surface 108 and the outer pad 122.

The first integrated circuit package 102 can include a first exposed interconnect 128 to provide an electrical connection to another packaging system. The first exposed interconnect 128 can be partially exposed from a first encapsulation 132, such as a cover including an epoxy molding compound, a film assisted molding, an encapsulation material, or a molding material.

The first exposed interconnect 128 can be represented by a stack of first conductive portions 130. The first conductive portions 130 can include a conductive material, such as nickel (Ni), aluminum (Al), palladium (Pd), tin (Sn), gold (Au), lead (Pb), copper (Cu), any other metal, a metallic alloy, or a combination thereof.

For illustrative purposes, the first conductive portions 130 are shown as stud bumps, although it is understood that the first conductive portions 130 can include a stacked bump, a conductive column, a metal conductor, a metallic alloy conductor, a conductive post, a conductive pillar, a conductive paste, or a conductive pin. Also for illustrative purposes, the cross-sectional view depicts four of the first conductive portions 130, although it is understood that there can be any number of the first conductive portions 130.

The first exposed interconnect 128 can be formed by manufacturing processes such as drilling, filling, evaporation, electrolytic plating, electroless plating, ball drop, screen printing, chemical treatment (e.g. acid treatment for good bonding ability), or a combination thereof. The first exposed interconnect 128 can also be formed by other manufacturing processes, which include stud bumping, wire bonding, compression bonding, stitch bond on the ball (RSSB), stand off bonding (SSB), or ball on the stitch.

The first exposed interconnect 128 can be mounted on the outer pad 122 that is connected to the stack substrate interconnect 126. For illustrative purposes, the first exposed interconnect 128 is shown to be adjacent the stack substrate interconnect 126, although it is understood that the first exposed interconnect 128 can be formed on the stack substrate interconnect 126 or the stack substrate interconnect 126 can be formed between two of the first conductive portions 130.

The first encapsulation 132 can be formed over the first substrate top surface 108, the component 110, the component interconnect 112, the attach layer 114, the stack substrate 116, and the stack substrate interconnect 126. The first encapsulation 132 can be formed to cover the first exposed interconnect 128.

The first exposed interconnect 128 can be partially exposed from the first encapsulation 132. In other words, a portion (e.g. the top) of the first exposed interconnect 128 can be exposed from the first encapsulation 132. The portion of the first exposed interconnect 128 that is exposed can be protruded or upwardly extended from the top surface of the first encapsulation 132.

The first encapsulation 132 can be formed with a recess 134 adjacent the first exposed interconnect 128. The stack substrate 116 and the inner pad 124 can be partially exposed from the first encapsulation 132. The stack substrate 116 and the inner pad 124 can be partially exposed in the recess 134.

For illustrative purposes, the first encapsulation 132 is shown with a taper side in the recess 134, although it is understood that the first encapsulation 132 can be formed differently. For example, the first encapsulation 132 can be formed with a vertical side in the recess 134.

The integrated circuit packaging system 100 can include a second integrated circuit package 136. The second integrated circuit package 136 can include a second substrate 138, such as a laminated plastic or ceramic substrate, an organic or inorganic substrate, a carrier, or a printed circuit board (PCB).

The second substrate 138 can include land pads, bond sites, conductive layers, or traces, for providing electrical connectivity. The second substrate 138 can include a second substrate bottom surface 140 and a second substrate top surface 142 opposite or over the second substrate bottom surface 140.

The second integrated circuit package 136 can include a first device 144, such as an integrated circuit die, a wirebond integrated circuit, or a chip, attached to or mounted over the second substrate top surface 142. The first device 144 can include a first device inactive side 146, such as a backside, and a first device active side 148 having active circuitry thereon at an opposing side to the first device inactive side 146.

The first device inactive side 146 can be attached to the second substrate 138. The first device 144 can be connected to the second substrate top surface 142 with a first device interconnect 150, such as a bond wire, a ribbon bond wire, or a conductive wire.

The second integrated circuit package 136 can include a second device 154, such as an integrated circuit die, a wirebond integrated circuit, or a chip, attached to or mounted over the first device active side 148. The second device 154 can include a second device inactive side 156, such as a backside, and a second device active side 158 having active circuitry thereon at an opposing side to the second device inactive side 156. The second device inactive side 156 can be attached to the first device active side 148.

The second integrated circuit package 136 can include a second exposed interconnect 160 to provide an electrical connection to the first integrated circuit package 102. The second exposed interconnect 160 can be attached or connected to the second device active side 158.

The second exposed interconnect 160 can be represented by a stack of second conductive portions 162. The second conductive portions 162 can include a conductive material, such as nickel (Ni), aluminum (Al), palladium (Pd), tin (Sn), gold (Au), lead (Pb), copper (Cu), any other metal, a metallic alloy, or a combination thereof.

For illustrative purposes, the second conductive portions 162 are shown as stud bumps, although it is understood that the second conductive portions 162 can include a stud bump, a stacked bump, a conductive column, a metal conductor, a metallic alloy conductor, a conductive post, a conductive pillar, a conductive paste, or a conductive pin. Also for illustrative purposes, the cross-sectional view depicts two of the second conductive portions 162, although it is understood that there can be any number of the second conductive portions 162.

The second exposed interconnect 160 can be formed by manufacturing processes such as drilling, filling, evaporation, electrolytic plating, electroless plating, ball drop, screen printing, chemical treatment (e.g. acid treatment for good bonding ability), or a combination thereof. The second exposed interconnect 160 can also be formed by other manufacturing processes, which include stud bumping, wire bonding, compression bonding, stitch bond on the ball (RSSB), stand off bonding (SSB), or ball on the stitch.

The second exposed interconnect 160 can be partially exposed from a second encapsulation 164, such as a cover including an epoxy molding compound, an encapsulation material, or a molding material. The second encapsulation 164 can be formed over the second substrate top surface 142, the first device 144, the first device interconnect 150, and the second device 154. The second encapsulation 164 can be formed to cover the second exposed interconnect 160.

The second exposed interconnect 160 can be partially exposed from the second encapsulation 164. In other words, a portion (e.g. the top) of the second exposed interconnect 160 can be exposed from the second encapsulation 164. The portion of the second exposed interconnect 160 that is exposed can be protruded or upwardly extended from the top surface of the second encapsulation 164.

The first exposed interconnect 128 and the second exposed interconnect 160 can have any shapes or dimensions. For example, the first exposed interconnect 128 can include a single integral structure that is formed with a common material and a shape of a cylinder, a pyramid, or a prism. Also for example, the second exposed interconnect 160 can have a width that is smaller than that of the first exposed interconnect 128.

The second encapsulation 164 can be formed by a molding process that includes a center gate mold. With the center gate mold, a portion of the second substrate top surface 142 at the periphery of the second substrate 138 is exposed from the second encapsulation 164. The portion of the second substrate top surface 142 that is exposed can be attached to, connected to, or joined with the first exposed interconnect 128.

For illustrative purposes, the second encapsulation 164 is shown having a taper side, although it is understood that the second encapsulation 164 can be formed differently. For example, the second encapsulation 164 can be formed having a vertical side.

The second integrated circuit package 136 can be mounted over the first integrated circuit package 102 with the second encapsulation 164 within the recess 134. The second exposed interconnect 160 can be mounted on the inner pad 124. The first exposed interconnect 128 can be attached or connected to the second substrate top surface 142 that is exposed from the second encapsulation 164.

The first device 144 of the second integrated circuit package 136 can be connected to the stack substrate 116 of the first integrated circuit package 102 with the first device interconnect 150, the second substrate 138, and the first exposed interconnect 128. The second device 154 of the second integrated circuit package 136 can be connected to the stack substrate 116 with the second exposed interconnect 160.

The integrated circuit packaging system 100 can optionally include an inter-package underfill 166, such as an epoxy resin or any underfill resin material. The inter-package underfill 166 be formed or dispensed in a space between the first integrated circuit package 102 and the second integrated circuit package 136 covering portions of the first exposed interconnect 128 and the second exposed interconnect 160. In other words, the inter-package underfill 166 can be formed in the recess 134 between the stack substrate top surface 120 and the second encapsulation 164, in the recess 134 between the first encapsulation 132 and the second encapsulation 164, or between the first encapsulation 132 and the second substrate top surface 142 that is exposed from the second encapsulation 164.

The integrated circuit packaging system 100 can include an external connector 168, such as a solder ball, a stud bump, a solder column, a metal conductor, or a metallic alloy conductor. The external connector 168 can be attached or connected to the first substrate bottom surface 106 for providing electrical connectivity to external systems.

It has been discovered that the first exposed interconnect 128 and the second exposed interconnect 160 eliminate solder ball bridging problems. Further, it has been discovered that the present invention provides the integrated circuit packaging system 100 with improved reliability.

It has also been discovered that the second encapsulation 164 within the recess 134 results in a significantly reduced height.

It has further been discovered that the inter-package underfill 166 formed between the first integrated circuit package 102 and the second integrated circuit package 136 provides increased joinability. Further, it has been discovered that the present invention provides further improved reliability.

Referring now to FIG. 2, therein is shown a top view of the integrated circuit packaging system 100. The top view depicts the first encapsulation 132 of the first integrated circuit package 102 of FIG. 1. The second substrate 138 of the second integrated circuit package 136 of FIG. 1 can be mounted over the first integrated circuit package 102. The inter-package underfill 166 can be formed between the first integrated circuit package 102 and the second integrated circuit package 136.

Figure 3:
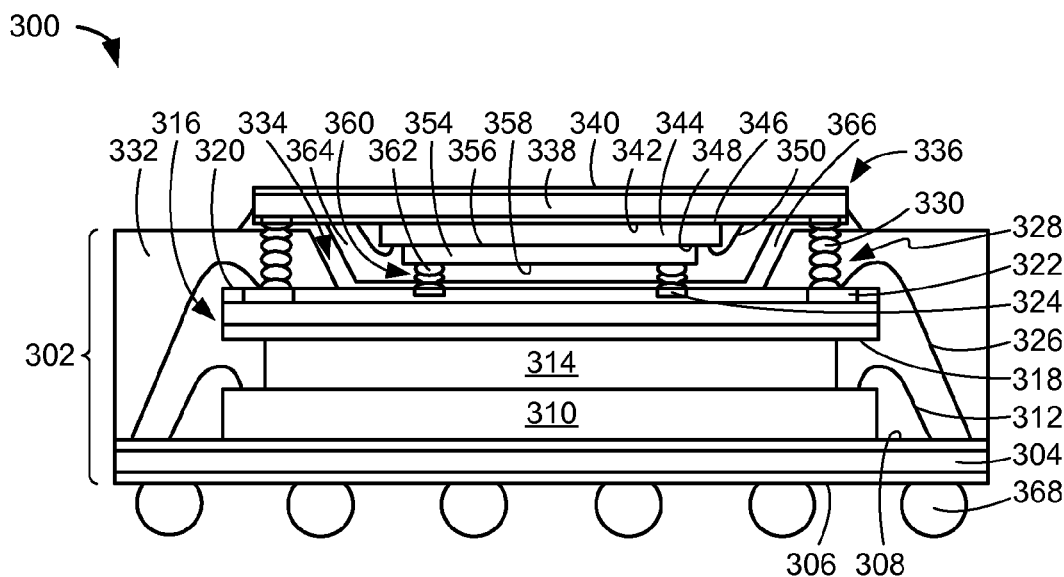
FIG. 3 is a cross-sectional view similar to FIG. 1 of an integrated circuit packaging system in a second embodiment of the present invention.

Referring now to FIG. 3, therein is shown a cross-sectional view similar to FIG. 1 of an integrated circuit packaging system 300 in a second embodiment of the present invention. The integrated circuit packaging system 300 can include substantially the same structures compared to the integrated circuit packaging system 100 of FIG. 1, except for the stack substrate 116 of FIG. 1, the first exposed interconnect 128 of FIG. 1, the second substrate 138 of FIG. 1, and the second exposed interconnect 160 of FIG. 1.

The integrated circuit packaging system 300 can include a first integrated circuit package 302 having a first substrate 304 with a first substrate bottom surface 306 and a first substrate top surface 308, a component 310, a component interconnect 312, and an attach layer 314. The first substrate 304, the component 310, the component interconnect 312, and the attach layer 314 can be formed in a manner similar to the first substrate 104 of FIG. 1, the component 110 of FIG. 1, the component interconnect 112 of FIG. 1, and the attach layer 114 of FIG. 1, respectively.

The first integrated circuit package 302 can include a stack substrate 316 having a stack substrate bottom surface 318, a stack substrate top surface 320, an outer pad 322, and an inner pad 324. The stack substrate 316 can be formed in a manner similar to the stack substrate 116 of FIG. 1, except that the stack substrate 316 includes an additional portion which will be described in more details later.

The first integrated circuit package 302 can include a stack substrate interconnect 326. The stack substrate interconnect 326 can be formed in a manner similar to the stack substrate interconnect 126 of FIG. 1.

The first integrated circuit package 302 can include a first exposed interconnect 328 having a stack of first conductive portions 330. The first exposed interconnect 328 can be formed in a manner similar to the first exposed interconnect 128 of FIG. 1, except that the first exposed interconnect 328 includes additional portions which will be described in more details later.

The first integrated circuit package 302 can include a first encapsulation 332 having a recess 334. The first encapsulation 332 can be formed in a manner similar to the first encapsulation 132 of FIG. 1.

The integrated circuit packaging system 300 can include a second integrated circuit package 336. The second integrated circuit package 336 can include a second substrate 338 having a second substrate bottom surface 340 and a second substrate top surface 342. The second substrate 338 can be formed in a manner similar to the second substrate 138 of FIG. 1, except that the second substrate 338 includes an additional portion which will be described in more details later.

The second integrated circuit package 336 can include a first device 344 having a first device inactive side 346 and a first device active side 348, a first device interconnect 350, and a second device 354 having a second device inactive side 356 and a second device active side 358. The first device 344, the first device interconnect 350, and the second device 354 can be formed in a manner similar to the first device 144 of FIG. 1, the first device interconnect 150 of FIG. 1, and the second device 154 of FIG. 1, respectively.

The second integrated circuit package 336 can include a second exposed interconnect 360 having a stack of second conductive portions 362. The second exposed interconnect 360 can be formed in a manner similar to the second exposed interconnect 160 of FIG. 1, except that the second exposed interconnect 360 includes additional portions which will be described in more details later.

The second integrated circuit package 336 can include a second encapsulation 364. The integrated circuit packaging system 300 can include an inter-package underfill 366 and an external connector 368. The second encapsulation 364, the inter-package underfill 366, and the external connector 368 can be formed in a manner similar to the second encapsulation 164 of FIG. 1, the inter-package underfill 166 of FIG. 1, and the external connector 168 of FIG. 1, respectively.

Figure 4:
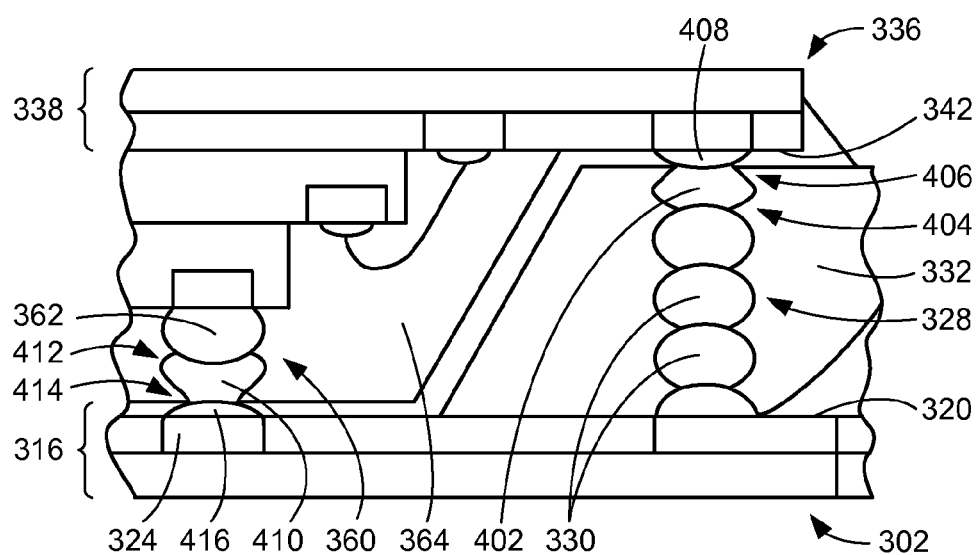
FIG. 4 is a more detailed cross-sectional view of a portion of FIG. 3.

Referring now to FIG. 4, therein is shown a more detailed cross-sectional view of a portion of FIG. 3. The more detailed cross-sectional view depicts the second integrated circuit package 336 mounted over the first integrated circuit package 302.

The first exposed interconnect 328 of the first integrated circuit package 302 can include a stack of the first conductive portions 330 and a first exposed conductive portion 402 formed over or connected to the first conductive portions 330.

The first exposed conductive portion 402 can include a first wide body 404 and a first narrow top 406 over the first wide body 404. The first exposed conductive portion 402 can be formed with the first wide body 404 having a width larger than that of the first narrow top 406.

The first wide body 404 can be attached over the first conductive portions 330. The first wide body 404 can include a bulge that outwardly extends from the side of the first exposed conductive portion 402.

The first narrow top 406 can include a substantially flat surface that can be substantially coplanar with the first encapsulation 332. The first narrow top 406 can be exposed from the first encapsulation 332.

The second substrate 338 can include a second substrate terminal 408, which can extend above the second substrate top surface 342 to provide connectivity with the first exposed interconnect 328. The second substrate terminal 408 can include a solder on pad (SOP), an electrical contact, or a contact pad. The second substrate terminal 408 can be attached or connected to the first narrow top 406 of the first exposed conductive portion 402.

The second exposed interconnect 360 of the second integrated circuit package 336 can include a stack of the second conductive portions 362 and a second exposed conductive portion 410 formed over or connected to the second conductive portions 362. The second exposed conductive portion 410, having a second wide body 412 and a second narrow top 414, can be formed with a structure that is substantially the same as that of the first exposed conductive portion 402.

The second wide body 412 can be attached over the second conductive portions 362. The second narrow top 414 can include a substantially flat surface that can be substantially coplanar with the second encapsulation 364. The second narrow top 414 can be exposed from the second encapsulation 364.

The stack substrate 316 can include a stack substrate terminal 416, which can be exposed from the first encapsulation 332 and extend above the stack substrate top surface 320. The stack substrate terminal 416 can be formed on the inner pad 324 of the stack substrate 316.

The stack substrate terminal 416 can be formed in a manner similar to the second substrate terminal 408. The stack substrate terminal 416 can be attached or connected to the second narrow top 414 of the second exposed conductive portion 410.

For illustrative purposes, the first exposed interconnect 328 is shown having a width similar to that of the second exposed interconnect 360, although it is understood that the first exposed interconnect 328 can have a different width. For example, the first exposed interconnect 328 can have a width larger than that of the second exposed interconnect 360.

Figure 5:
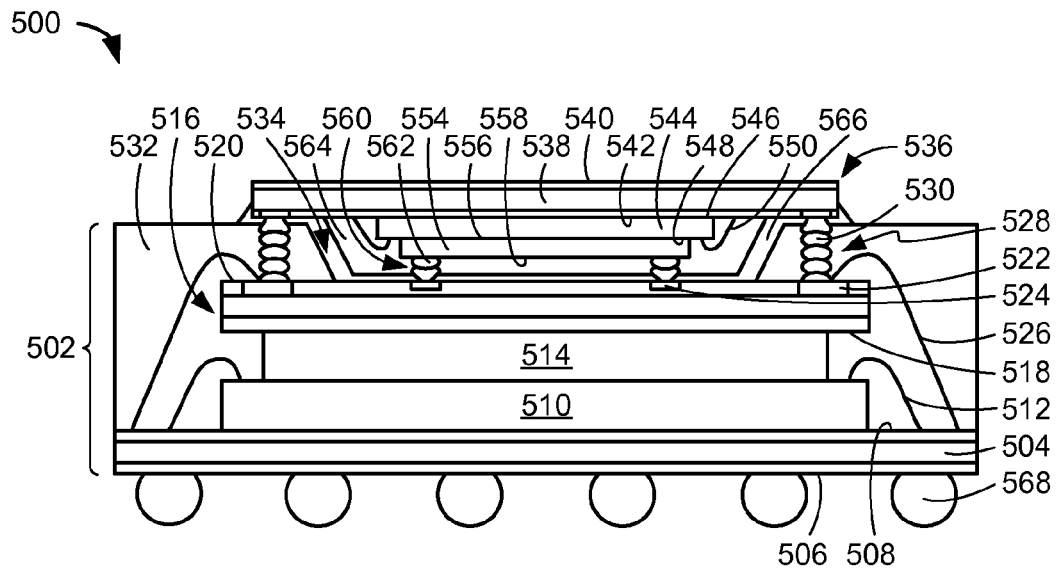
FIG. 5 is a cross-sectional view similar to FIG. 1 of an integrated circuit packaging system in a third embodiment of the present invention.

Referring now to FIG. 5, therein is shown a cross-sectional view similar to FIG. 1 of an integrated circuit packaging system 500 in a third embodiment of the present invention. The integrated circuit packaging system 500 can include substantially the same structures compared to the integrated circuit packaging system 100 of FIG. 1, except for the first exposed interconnect 128 of FIG. 1 and the second exposed interconnect 160 of FIG. 1.

The integrated circuit packaging system 500 can include a first integrated circuit package 502 having a first substrate 504 with a first substrate bottom surface 506 and a first substrate top surface 508, a component 510, a component interconnect 512, and an attach layer 514. The first substrate 504, the component 510, the component interconnect 512, and the attach layer 514 can be formed in a manner similar to the first substrate 104 of FIG. 1, the component 110 of FIG. 1, the component interconnect 112 of FIG. 1, and the attach layer 114 of FIG. 1, respectively.

The first integrated circuit package 502 can include a stack substrate 516 having a stack substrate bottom surface 518 and a stack substrate top surface 520, an outer pad 522, and an inner pad 524. The stack substrate 516 can be formed in a manner similar to the stack substrate 116 of FIG. 1.

The first integrated circuit package 502 can include a stack substrate interconnect 526. The stack substrate interconnect 526 can be formed in a manner similar to the stack substrate interconnect 126 of FIG. 1.

The first integrated circuit package 502 can include a first exposed interconnect 528 having a stack of first conductive portions 530. The first exposed interconnect 528 can be formed in a manner similar to the first exposed interconnect 128 of FIG. 1, except that the first exposed interconnect 528 includes additional portions which will be described in more details later.

The first integrated circuit package 502 can include a first encapsulation 532 having a recess 534. The first encapsulation 532 can be formed in a manner similar to the first encapsulation 132 of FIG. 1.

The integrated circuit packaging system 500 can include a second integrated circuit package 536. The second integrated circuit package 536 can include a second substrate 538 having a second substrate bottom surface 540 and a second substrate top surface 542. The second substrate 538 can be formed in a manner similar to the second substrate 138 of FIG. 1.

The second integrated circuit package 536 can include a first device 544 having a first device inactive side 546 and a first device active side 548, a first device interconnect 550, and a second device 554 having a second device inactive side 556 and a second device active side 558. The first device 544, the first device interconnect 550, and the second device 554 can be formed in a manner similar to the first device 144 of FIG. 1, the first device interconnect 150 of FIG. 1, and the second device 154 of FIG. 1.

The second integrated circuit package 536 can include a second exposed interconnect 560 having a stack of second conductive portions 562. The second exposed interconnect 560 can be formed in a manner similar to the second exposed interconnect 160 of FIG. 1, except that the second exposed interconnect 560 includes additional portions which will be described in more details later.

The second integrated circuit package 536 can include a second encapsulation 564. The integrated circuit packaging system 500 can include an inter-package underfill 566 and an external connector 568. The second encapsulation 564, the inter-package underfill 566, and the external connector 568 can be formed in a manner similar to the second encapsulation 164 of FIG. 1, the inter-package underfill 166 of FIG. 1, and the external connector 168 of FIG. 1.

Figure 6:
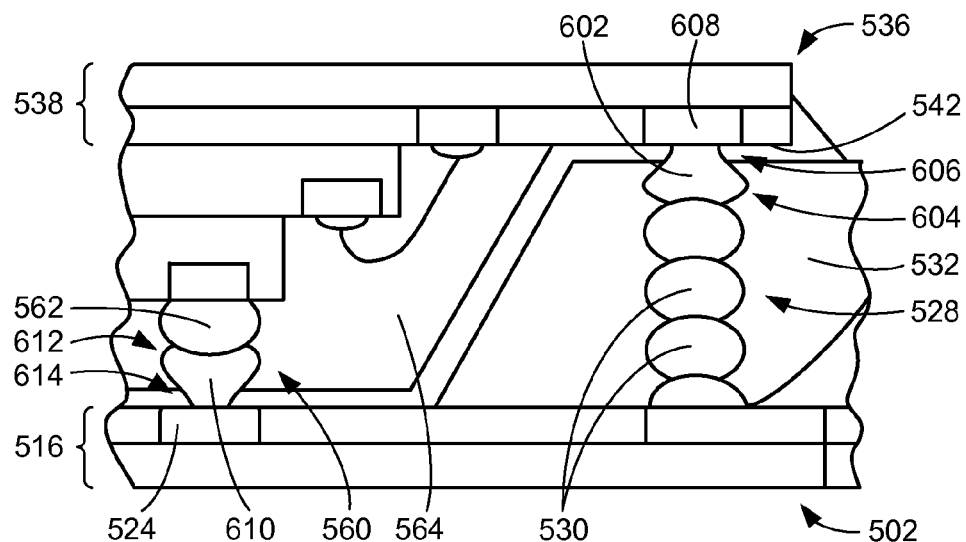
FIG. 6 is a more detailed cross-sectional view of a portion of FIG. 5.

Referring now to FIG. 6, therein is shown a more detailed cross-sectional view of a portion of FIG. 5. The more detailed cross-sectional view depicts the second integrated circuit package 536 mounted over the first integrated circuit package 502.

The first exposed interconnect 528 of the first integrated circuit package 502 can include a stack of the first conductive portions 530 and a first exposed conductive portion 602 formed over or connected to the first conductive portions 530.

The first exposed conductive portion 602 can include a first wide body 604 and a first narrow top 606 over the first wide body 604. The first exposed conductive portion 602 can be formed with the first wide body 604 having a width larger than that of the first narrow top 606.

The first wide body 604 can be attached over the first conductive portions 530. The first wide body 604 can include a bulge that outwardly extends from the side of the first exposed conductive portion 602.

The first narrow top 606 can be formed to extend above the first encapsulation 532. The first narrow top 606 can be attached or connected to a second substrate terminal 608, such as a pad, a lead, or an electrical contact, of the second substrate 538. The second substrate terminal 608 can be formed on a portion of the second substrate top surface 542 that is exposed from the second encapsulation 564. The second substrate 538 can represent a configuration of a substrate with a no solder on pad (nSOP) type.

The second exposed interconnect 560 of the second integrated circuit package 536 can include a stack of the second conductive portions 562 and a second exposed conductive portion 610 formed over or connected to the second conductive portions 562. The second exposed conductive portion 610, having a second wide body 612 and a second narrow top 614, can be formed with a structure that is substantially the same as that of the first exposed conductive portion 602.

The second wide body 612 can be attached over the second conductive portions 562. The second narrow top 614 can be attached or connected to the inner pad 524 of the stack substrate 516.

For illustrative purposes, the first exposed interconnect 528 is shown having a width similar to that of the second exposed interconnect 560, although it is understood that the first exposed interconnect 528 can have a different width. For example, the first exposed interconnect 528 can have a width larger than that of the second exposed interconnect 560.

Figure 7:
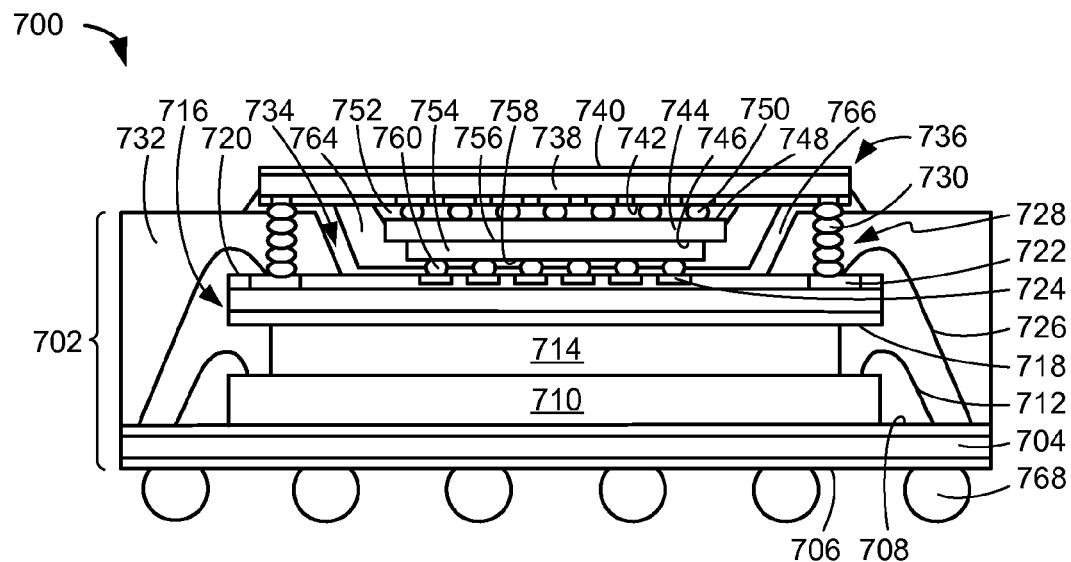
FIG. 7 is a cross-sectional view similar to FIG. 1 of an integrated circuit packaging system in a fourth embodiment of the present invention.

Referring now to FIG. 7, therein is shown a cross-sectional view similar to FIG. 1 of an integrated circuit packaging system 700 in a fourth embodiment of the present invention. The integrated circuit packaging system 700 can include similar structures compared to the integrated circuit packaging system 100 of FIG. 1, except for the first device 144 of FIG. 1, the first device interconnect 150 of FIG. 1, the second device 154 of FIG. 1, and the second exposed interconnect 160 of FIG. 1.

The integrated circuit packaging system 700 can include a first integrated circuit package 702 having a first substrate 704 with a first substrate bottom surface 706 and a first substrate top surface 708, a component 710, a component interconnect 712, and an attach layer 714. The first substrate 704, the component 710, the component interconnect 712, and the attach layer 714 can be formed in a manner similar to the first substrate 104 of FIG. 1, the component 110 of FIG. 1, the component interconnect 112 of FIG. 1, and the attach layer 114 of FIG. 1, respectively.

The first integrated circuit package 702 can include a stack substrate 716 having a stack substrate bottom surface 718, a stack substrate top surface 720, an outer pad 722, and an inner pad 724. The stack substrate 716 can be formed in a manner similar to the stack substrate 116 of FIG. 1.

The first integrated circuit package 702 can include a stack substrate interconnect 726, a first exposed interconnect 728 having a stack of first conductive portions 730, and a first encapsulation 732 having a recess 734. The stack substrate interconnect 726, the first exposed interconnect 728, and the first encapsulation 732 can be formed in a manner similar to the stack substrate interconnect 126 of FIG. 1, the first exposed interconnect 128 of FIG. 1, and the first encapsulation 132 of FIG. 1, respectively.

The integrated circuit packaging system 700 can include a second integrated circuit package 736. The second integrated circuit package 736 can include a second substrate 738 having a second substrate bottom surface 740 and a second substrate top surface 742. The second substrate 738 can be formed in a manner similar to the second substrate 138 of FIG. 1.

The second integrated circuit package 736 can include a first device 744, such as a flip-chip, an integrated circuit die, a packaged integrated circuit, or a bumped chip, attached to or mounted over the second substrate top surface 742. The first device 744 can include a first device inactive side 746, such as a backside, and a first device active side 748 having active circuitry thereon at an opposing side to the first device inactive side 746.

The first device active side 748 can be attached to the second substrate 738. The first device 744 can be connected to the second substrate top surface 742 with a first device interconnect 750, such as a solder ball, a stud bump, a solder column, a metal conductor, or a metallic alloy conductor.

The second integrated circuit package 736 can include an internal underfill 752, such as an epoxy resin or any underfill resin material. The internal underfill 752 can be formed or dispensed in a space between the second substrate 738 and the first device 744. The internal underfill 752 can protect or encapsulate the first device interconnect 750.

The second integrated circuit package 736 can include a second device 754, such as a flip-chip, an integrated circuit die, a packaged integrated circuit, or a bumped chip, attached to or mounted over the first device 744. The second device 754 can include a second device inactive side 756, such as a backside, and a second device active side 758 having active circuitry thereon at an opposing side to the second device inactive side 756. The second device inactive side 756 can be attached to the first device inactive side 746.

The second integrated circuit package 736 can include a second exposed interconnect 760, such as a solder ball, a stud bump, a solder column, a metal conductor, or a metallic alloy conductor. The second exposed interconnect 760 provides an electrical connection to the first integrated circuit package 702. The second exposed interconnect 760 can be attached or connected to the second device active side 758 and the inner pad 724 of the stack substrate 716.

The second exposed interconnect 760 can be partially exposed from a second encapsulation 764, such as a cover including an epoxy molding compound, an encapsulation material, or a molding material. The second encapsulation 764 can be formed in a manner similar to the second encapsulation 164 of FIG. 1.

For illustrative purposes, the second integrated circuit package 736 is shown to include the internal underfill 752, although it is understood that the internal underfill 752 is optional. Without the internal underfill 752, the second integrated circuit package 736 can be formed with a mold underfill (MUF) process. In other words, the second encapsulation 764 can also be formed in the space between the second substrate 738 and the first device 744 to protect or encapsulate the first device interconnect 750.

The integrated circuit packaging system 700 can include an inter-package underfill 766 and an external connector 768. The inter-package underfill 766 and the external connector 768 can be formed in a manner similar to the inter-package underfill 166 of FIG. 1 and the external connector 168 of FIG. 1.

Figure 8:
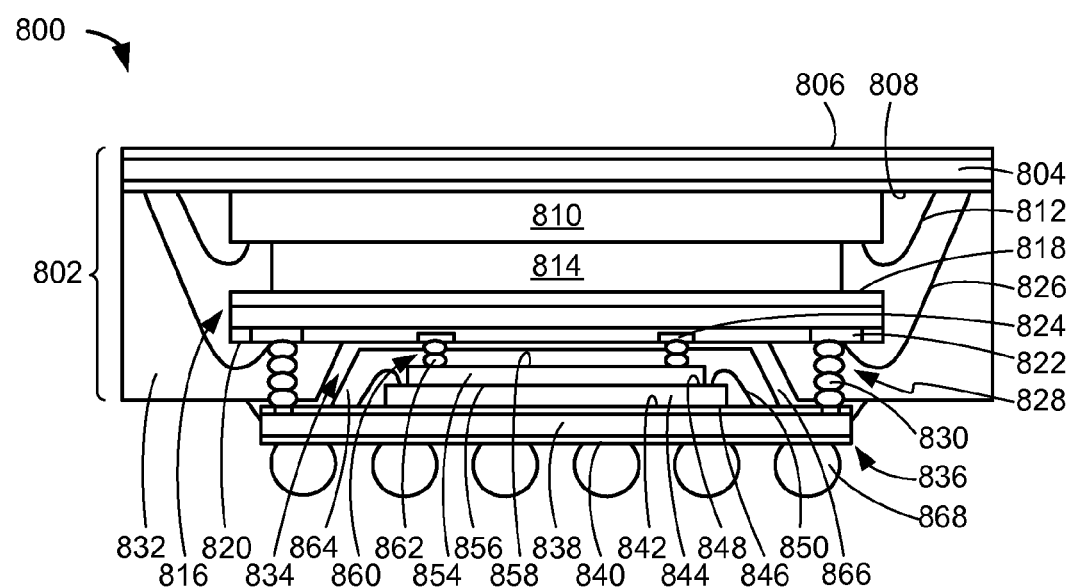
FIG. 8 is a cross-sectional view similar to FIG. 1 of an integrated circuit packaging system in a fifth embodiment of the present invention.

Referring now to FIG. 8, therein is shown a cross-sectional view similar to FIG. 1 of an integrated circuit packaging system 800 in a fifth embodiment of the present invention. The integrated circuit packaging system 800 can include substantially the same structures compared to the integrated circuit packaging system 100 of FIG. 1, except for the mounting phase of the first integrated circuit package 102 of FIG. 1, the second integrated circuit package 136 of FIG. 1, and the external connector 168 of FIG. 1.

The integrated circuit packaging system 800 can include a first integrated circuit package 802 having a first substrate 804 with a first substrate bottom surface 806 and a first substrate top surface 808, a component 810, a component interconnect 812, and an attach layer 814. The first substrate 804, the component 810, the component interconnect 812, and the attach layer 814 can be formed in a manner similar to the first substrate 104 of FIG. 1, the component 110 of FIG. 1, the component interconnect 112 of FIG. 1, and the attach layer 114 of FIG. 1, respectively.

The first integrated circuit package 802 can include a stack substrate 816 having a stack substrate bottom surface 818, a stack substrate top surface 820, an outer pad 822, and an inner pad 824. The stack substrate 816 can be formed in a manner similar to the stack substrate 116 of FIG. 1.

The first integrated circuit package 802 can include a stack substrate interconnect 826, a first exposed interconnect 828 having a stack of first conductive portions 830, and a first encapsulation 832 having a recess 834. The stack substrate interconnect 826, the first exposed interconnect 828, and the first encapsulation 832 can be formed in a manner similar to the stack substrate interconnect 126 of FIG. 1, the first exposed interconnect 128 of FIG. 1, and the first encapsulation 132 of FIG. 1, respectively.

The integrated circuit packaging system 800 can include a second integrated circuit package 836. The second integrated circuit package 836 can include a second substrate 838 having a second substrate bottom surface 840 and a second substrate top surface 842. The second substrate 838 can be formed in a manner similar to the second substrate 138 of FIG. 1.

The second integrated circuit package 836 can include a first device 844 having a first device inactive side 846 and a first device active side 848, a first device interconnect 850, and a second device 854 having a second device inactive side 856 and a second device active side 858. The first device 844, the first device interconnect 850, and the second device 854 can be formed in a manner similar to the first device 144 of FIG. 1, the first device interconnect 150 of FIG. 1, and the second device 154 of FIG. 1, respectively.

The second integrated circuit package 836 can include a second exposed interconnect 860, having a stack of second conductive portions 862, and a second encapsulation 864. The integrated circuit packaging system 800 can include an inter-package underfill 866. The second exposed interconnect 860, the second encapsulation 864, and the inter-package underfill 866 can be formed in a manner similar to the second exposed interconnect 160 of FIG. 1, the second encapsulation 164 of FIG. 1, and the inter-package underfill 166 of FIG. 1, respectively.

The first integrated circuit package 802 can be mounted over the second integrated circuit package 836. The first exposed interconnect 828 can be attached or connected to a portion of the second substrate top surface 842 that is exposed from the second encapsulation 864. The second exposed interconnect 860 can be attached or connected to the inner pad 824.

The integrated circuit packaging system 800 can include an external connector 868, such as a solder ball, a stud bump, a solder column, a metal conductor, or a metallic alloy conductor. The external connector 868 can be attached or connected to the second substrate bottom surface 840 for providing electrical connectivity to external systems.

It has been discovered that the first integrated circuit package 802 mounted over the second integrated circuit package 836 provides increased integration, allowing additional devices or packaging systems mounted over the first integrated circuit package 802.

Figure 9:
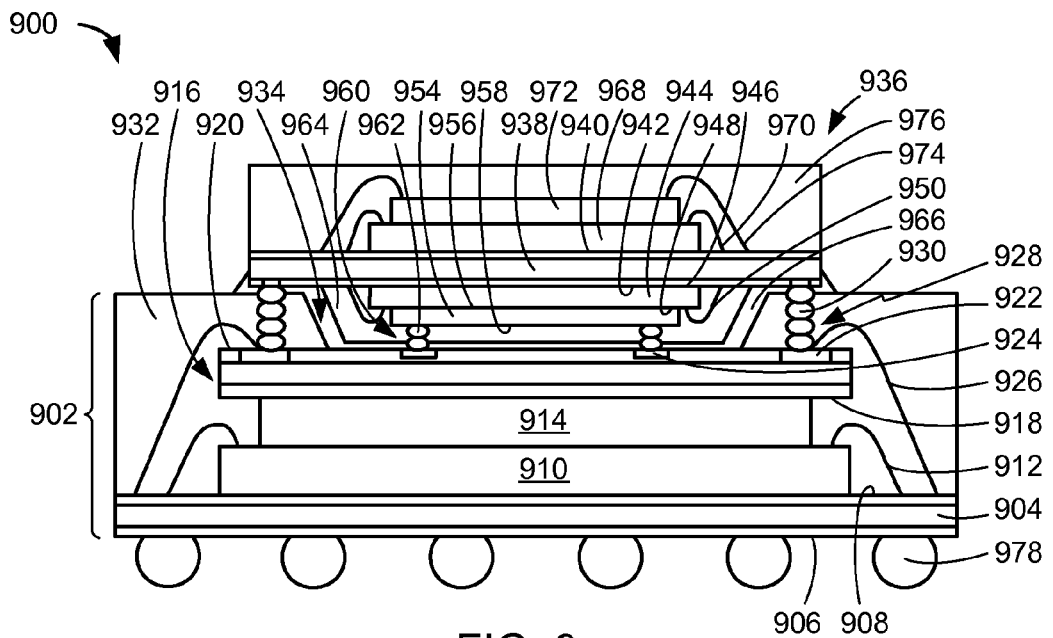
FIG. 9 is a cross-sectional view similar to FIG. 1 of an integrated circuit packaging system in a sixth embodiment of the present invention.

Referring now to FIG. 9, therein is shown a cross-sectional view similar to FIG. 1 of an integrated circuit packaging system 900 in a sixth embodiment of the present invention. The integrated circuit packaging system 900 can include substantially the same structures compared to the integrated circuit packaging system 100 of FIG. 1, except for the second integrated circuit package 136 of FIG. 1.

The integrated circuit packaging system 900 can include a first integrated circuit package 902 having a first substrate 904 with a first substrate bottom surface 906 and a first substrate top surface 908, a component 910, a component interconnect 912, and an attach layer 914. The first substrate 904, the component 910, the component interconnect 912, and the attach layer 914 can be formed in a manner similar to the first substrate 104 of FIG. 1, the component 110 of FIG. 1, the component interconnect 112 of FIG. 1, and the attach layer 114 of FIG. 1, respectively.

The first integrated circuit package 902 can include a stack substrate 916 having a stack substrate bottom surface 918, a stack substrate top surface 920, an outer pad 922, and an inner pad 924. The stack substrate 916 can be formed in a manner similar to the stack substrate 116 of FIG. 1.

The first integrated circuit package 902 can include a stack substrate interconnect 926, a first exposed interconnect 928 having a stack of first conductive portions 930, and a first encapsulation 932 having a recess 934. The stack substrate interconnect 926, the first exposed interconnect 928, and the first encapsulation 932 can be formed in a manner similar to the stack substrate interconnect 126 of FIG. 1, the first exposed interconnect 128 of FIG. 1, and the first encapsulation 132 of FIG. 1, respectively.

The integrated circuit packaging system 900 can include a second integrated circuit package 936. The second integrated circuit package 936 can include a second substrate 938 having a second substrate bottom surface 940 and a second substrate top surface 942. The second substrate 938 can be formed in a manner similar to the second substrate 138 of FIG. 1.

The second integrated circuit package 936 can include a first device 944 having a first device inactive side 946 and a first device active side 948, a first device interconnect 950, and a second device 954 having a second device inactive side 956 and a second device active side 958. The first device 944, the first device interconnect 950, and the second device 954 can be formed in a manner similar to the first device 144 of FIG. 1, the first device interconnect 150 of FIG. 1, and the second device 154 of FIG. 1.

The second integrated circuit package 936 can include a second exposed interconnect 960, having a stack of second conductive portions 962, and a second encapsulation 964. The integrated circuit packaging system 900 can include an inter-package underfill 966. The second exposed interconnect 960, the second encapsulation 964, and the inter-package underfill 966 can be formed in a manner similar to the second exposed interconnect 160 of FIG. 1, the second encapsulation 164 of FIG. 1, and the inter-package underfill 166 of FIG. 1.

The second integrated circuit package 936 can include a third device 968, such as an integrated circuit die, a wirebond integrated circuit, or a chip, attached to or mounted over the second substrate bottom surface 940. A third device interconnect 970, such as a bond wire, a ribbon bond wire, or a conductive wire, can be attached or connected to the second substrate bottom surface 940 and the third device 968.

The second integrated circuit package 936 can include a fourth device 972, such as an integrated circuit die, a wirebond integrated circuit, or a chip, attached to or mounted over the third device 968. A fourth device interconnect 974, such as a bond wire, a ribbon bond wire, or a conductive wire, can be attached or connected to the second substrate bottom surface 940 and the fourth device 972.

The second integrated circuit package 936 can include a third encapsulation 976, such as a cover including an epoxy molding compound, an encapsulation material, or a molding material. The third encapsulation 976 can be formed over the third device 968, the third device interconnect 970, the fourth device 972, and the fourth device interconnect 974.

The integrated circuit packaging system 900 can include an external connector 978. The external connector 978 can be formed in a manner similar to the external connector 168 of FIG. 1.

It has been discovered that the third device 968 and the fourth device 972 mounted over the second substrate bottom surface 940 greatly increases integration.

Figure 10:
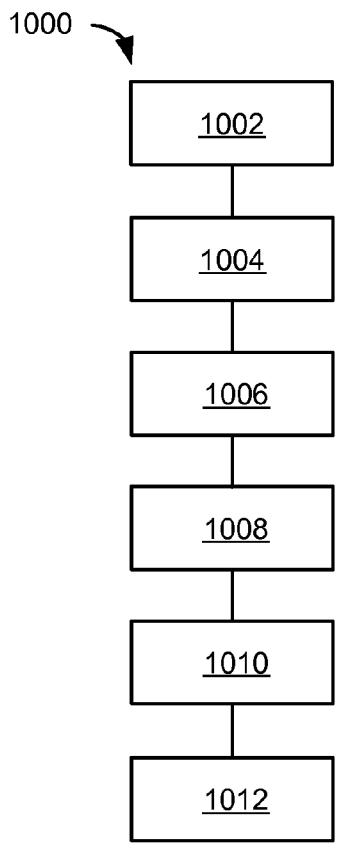
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system in a further embodiment of the present invention. The method 1000 includes: providing a first substrate in a block 1002; mounting a component over the first substrate in a block 1004; mounting a stack substrate over the component, the stack substrate having an inner pad and an outer pad connected to the first substrate in a block 1006; mounting a first exposed interconnect on the outer pad in a block 1008; forming a first encapsulation over the stack substrate, the first exposed interconnect partially exposed and the inner pad partially exposed in a recess of the first encapsulation in a block 1010; and mounting a second exposed interconnect on the inner pad in a block 1012.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a first substrate;
   mounting a component over the first substrate;
   mounting a stack substrate over the component, the stack substrate having an inner pad and an outer pad connected to the first substrate;
   mounting a first exposed interconnect on the outer pad;
   forming a first encapsulation over the stack substrate, the first exposed interconnect partially exposed and the inner pad partially exposed in a recess of the first encapsulation; and
   mounting a second exposed interconnect on the inner pad.

2. The method as claimed in claim 1 further comprising:
   providing a second substrate;
   connecting a first device to the second substrate; and
   attaching the second substrate to the first exposed interconnect.

3. The method as claimed in claim 1 further comprising connecting a second device to the stack substrate.

4. The method as claimed in claim 1 further comprising:
   forming a second encapsulation with the second exposed interconnect partially exposed; and
   forming an inter-package underfill between the second encapsulation and the stack substrate.

5. The method as claimed in claim 1 further comprising:
   providing a second substrate having a second substrate bottom surface and a second substrate top surface opposite the second substrate bottom surface;
   attaching a first device to the second substrate top surface;
   attaching a third device to the second substrate bottom surface; and
   attaching the second substrate to the first exposed interconnect.

6. A method of manufacture of an integrated circuit packaging system comprising:
   providing a first substrate;
   mounting a component over the first substrate;
   mounting a stack substrate over the component, the stack substrate having an inner pad and an outer pad adjacent the inner pad and along the periphery of the stack substrate;
   connecting a stack substrate interconnect to the first substrate and the outer pad;
   mounting a first exposed interconnect on the outer pad;
   forming a first encapsulation over the stack substrate, the first exposed interconnect partially exposed and the inner pad partially exposed in a recess of the first encapsulation; and
   mounting a second exposed interconnect on the inner pad.

7. The method as claimed in claim 6 further comprising:
   forming the first exposed interconnect having a first wide body and a first narrow top over the first wide body; and
   attaching a second substrate, having a second substrate top surface and a second substrate terminal extended above the second substrate top surface, to the first exposed interconnect with the second substrate terminal connected to the first narrow top.

8. The method as claimed in claim 6 further comprising:
   forming the first exposed interconnect having a first wide body and a first narrow top over the first wide body; and
   attaching a second substrate to the first exposed interconnect with the second substrate having a second substrate terminal connected to the first narrow top extended above the first encapsulation.

9. The method as claimed in claim 6 further comprising:
   forming a second substrate having a second substrate bottom surface and a second substrate top surface attached to the first exposed interconnect; and
   attaching an external connector to the second substrate bottom surface.

10. The method as claimed in claim 6 further comprising connecting a flip-chip to the stack substrate.

11. An integrated circuit packaging system comprising:
    a first substrate;
    a component over the first substrate;
    a stack substrate over the component, the stack substrate having an inner pad and an outer pad connected to the first substrate;
    a first exposed interconnect on the outer pad;
    a first encapsulation over the stack substrate, the first exposed interconnect partially exposed and the inner pad partially exposed in a recess of the first encapsulation; and
    a second exposed interconnect on the inner pad.

12. The system as claimed in claim 11 further comprising:
a second substrate attached to the first exposed interconnect; and
a first device connected to the second substrate.

13. The system as claimed in claim 11 further comprising a second device connected to the stack substrate.

14. The system as claimed in claim 11 further comprising:
a second encapsulation with the second exposed interconnect partially exposed; and
an inter-package underfill between the second encapsulation and the stack substrate.

15. The system as claimed in claim 11 further comprising:
a second substrate attached to the first exposed interconnect with the second substrate having a second substrate bottom surface and a second substrate top surface opposite the second substrate bottom surface;
a first device attached to the second substrate top surface; and
a third device attached to the second substrate bottom surface.

16. The system as claimed in claim 11 further comprising a stack substrate interconnect connected to the first substrate and the outer pad with the outer pad adjacent the inner pad and along the periphery of the stack substrate.

17. The system as claimed in claim 16 wherein:
the first exposed interconnect includes a first wide body and a first narrow top over the first wide body; and
further comprising:
a second substrate, having a second substrate top surface and a second substrate terminal extended above the second substrate top surface, attached to the first exposed interconnect with the second substrate terminal connected to the first narrow top.

18. The system as claimed in claim 16 wherein:
the first exposed interconnect includes a first wide body and a first narrow top over the first wide body; and
further comprising:
a second substrate attached to the first exposed interconnect with the second substrate having a second substrate terminal connected to the first narrow top extended above the first encapsulation.

19. The system as claimed in claim 16 further comprising:
a second substrate having a second substrate bottom surface and a second substrate top surface attached to the first exposed interconnect; and
an external connector attached to the second substrate bottom surface.

20. The system as claimed in claim 16 further comprising a flip-chip connected to the stack substrate.

* * * * *